(12) United States Patent
Rajwan

(10) Patent No.: US 7,304,990 B2
(45) Date of Patent: Dec. 4, 2007

(54) METHOD OF ENCODING AND TRANSMITTING DATA OVER A COMMUNICATION MEDIUM THROUGH DIVISION AND SEGMENTATION

(75) Inventor: Doron Rajwan, Givataim (IL)

(73) Assignee: Bandwiz Inc., Herzlia Pituach (IL)

( * ) Notice: Subject to any disclaimer, the term of this patent is extended or adjusted under 35 U.S.C. 154(b) by 885 days.

(21) Appl. No.: 10/049,884

(22) PCT Filed: Feb. 2, 2001

(86) PCT No.: PCT/IL01/00105

§ 371 (c)(1), (2), (4) Date: Feb. 12, 2002

(87) PCT Pub. No.: WO01/58130

PCT Pub. Date: Aug. 9, 2001

(65) Prior Publication Data

US 2003/0002533 A1   Jan. 2, 2003

Related U.S. Application Data (60) Provisional application No. 60/179,926, filed on Feb. 3, 2000, provisional application No. 60/217,139, filed on Jul. 10, 2000, provisional application No. 60/245,000, filed on Nov. 1, 2000, provisional application No. 60/245,098, filed on Nov. 2, 2000.

(30) Foreign Application Priority Data

| Aug. 1, 2000 | (IL) | .................... 137624 |
| Aug. 27, 2000 | (IL) | .................... 138114 |
| Dec. 24, 2000 | (IL) | .................... 140504 |

(51) Int. Cl.
H04L 12/28 (2006.01)
H04J 3/24 (2006.01)
H03M 13/00 (2006.01)

(52) U.S. Cl. .................. 370/389; 370/474; 714/776

(58) Field of Classification Search ............. 370/474, 370/464, 389, 468, 470, 32.1, 32, 313–316, 370/221, 216, 254, 225, 227, 242, 244, 228, 370/238, 289; 375/244, 267, 347, 8, 9, 27, 375/39, 48, 51, 56, 58; 379/410, 411, 93, 379/97, 98; 341/50, 51, 60, 173; 709/231, 709/241, 238, 239, 244, 243, 204; 714/746, 714/776, 22, 710, 784, 781, 755, 15, 756, 714/6, 49, 7, 54, 764

See application file for complete search history.

(56) References Cited

U.S. PATENT DOCUMENTS 5,063,574 A * 11/1991 Moose ................. 375/244

(Continued)

*Primary Examiner*—Wing Chan
*Assistant Examiner*—Hong Sol Cho (57) ABSTRACT

A method of encoding and transmitting data over a communication medium, comprising, providing a file; dividing said file into a plurality of buckets; segmenting each bucket into a et of blocks; selecting a subset of blocks from a bucket; generating a packet by combining said selected blocks, such that an individual block cannot be reconstructed from a single packet; repeating said selecting and said generating for a plurality of buckets and a plurality of packets; generating at last one cross-bucket packet by combining blocks from different buckets and transmitting said generated packets and said generated cross-packets, said packets and said cross-packets being marked as such.

30 Claims, 5 Drawing Sheets

U.S. PATENT DOCUMENTS

| | | | |
|---|---|---|---|
| 5,166,924 A * | 11/1992 | Moose | 370/289 |
| 5,369,533 A * | 11/1994 | Ottesen et al. | 360/51 |
| 5,446,759 A * | 8/1995 | Campana, Jr. | 375/267 |
| 5,485,474 A * | 1/1996 | Rabin | 714/762 |
| 5,511,003 A * | 4/1996 | Agarwal | 709/204 |
| 5,710,798 A * | 1/1998 | Campana, Jr. | 375/347 |
| 5,717,725 A * | 2/1998 | Campana, Jr. | 375/347 |
| 5,745,532 A * | 4/1998 | Campana, Jr. | 375/347 |
| 5,870,564 A * | 2/1999 | Jensen et al. | 709/241 |
| 6,014,694 A * | 1/2000 | Aharoni et al. | 709/219 |
| 6,067,572 A * | 5/2000 | Jensen et al. | 709/241 |
| 6,073,250 A * | 6/2000 | Luby et al. | 714/6 |
| 6,075,665 A * | 6/2000 | Chainer et al. | 360/48 |
| 6,088,330 A * | 7/2000 | Bruck et al. | 370/228 |
| 6,128,277 A * | 10/2000 | Bruck et al. | 370/221 |
| 6,134,243 A * | 10/2000 | Jones et al. | 370/465 |
| 6,141,053 A * | 10/2000 | Saukkonen | 375/240.01 |
| 6,272,190 B1 * | 8/2001 | Campana, Jr. | 375/347 |
| 6,317,515 B1 * | 11/2001 | Kurtze et al. | 382/166 |
| 6,460,153 B1 * | 10/2002 | Chou et al. | 714/746 |
| 6,470,469 B1 * | 10/2002 | Chou et al. | 714/746 |
| 6,522,635 B1 * | 2/2003 | Bedwell | 370/314 |
| 6,771,674 B1 * | 8/2004 | Schuster et al. | 370/537 |
| 6,871,314 B2 * | 3/2005 | Ohira et al. | 714/776 |
| 6,907,473 B2 * | 6/2005 | Schmidt et al. | 709/248 |
| 7,003,111 B2 * | 2/2006 | Jaquette | 380/46 |
| 2004/0260863 A1 * | 12/2004 | Gemmell | 711/100 |

* cited by examiner

METHOD OF ENCODING AND TRANSMITTING DATA OVER A COMMUNICATION MEDIUM THROUGH DIVISION AND SEGMENTATION

RELATED APPLICATIONS

This application is a U.S. national filing of PCT application No. PCT/IL01/00105, filed Feb. 2, 2001. This application is related to and claims the benefit under 35 USC 119(e) of U.S. Ser. No. 60/179,926 filed on Feb. 3, 2000, U.S. Ser. No. 60/217,139 filed on Jul. 10, 2000, U.S. Ser. No. 60/245,000 filed on Nov. 1, 2000 and U.S. Ser. No. 60/245,098 filed on Nov. 2, 2000. This application is also related to Israeli applications 137,624 filed on Aug. 1, 2000, 138,114 filed on Aug. 27, 2000 and 140,504 filed Dec. 24, 2000. This application is also related to PCT/IL01/00106, filed Feb. 2, 2001 and PCT/IL01/00107 filed Feb. 2, 2001 designating the U.S. The disclosure of all of these applications is incorporated herein by reference.

FIELD OF THE INVENTION

The present invention relates to robust codes for transmission of data.

BACKGROUND

Many data encoding methods have been suggested for data which is to be transmitted. Such codes may include, for example, error detecting codes, error correction codes, codes which allow for some data packets to be missed and encryption codes.

The usage of a coding scheme is suggested in Internet draft numbers draft-ietf-rmt-bb-fec-02 (Nov. 17, 2000), and draft-ietf-rmt-pi-alc-01 (Jul. 13, 2000), the disclosures of which are incorporated herein by reference.

Loss resilient coding methods are described, for example, in U.S. Pat. Nos. 6,081,909 and 6,073,250, the disclosures of which are incorporated herein by reference.

In an exemplary coding method, a data file is encoded by dividing the file into blocks and generating a series of data packets, each packet being formed by combining several blocks. The data blocks are combined, for example, using a XOR function between the data blocks.

SUMMARY OF THE INVENTION

Some aspects of some embodiments of the invention relate to efficient decoding of received data. In some embodiments of the invention, the requirements for CPU, memory and/or latency are reduced. In an exemplary embodiment of the invention, received data is decoded by representing the received data as a set of equations and solving the equations to reconstruct the data. Alternatively, other solving methods are used.

An aspect of some embodiments of the invention relates to generating a substantially infinite encoding from limited data. In an exemplary embodiment of the invention, a code is generated by randomly selecting parts of the data and combining the parts into an encoded packet. In an exemplary embodiment of the invention, the randomization is achieved using a seed-based random number generator, so that a receiver can reconstruct which file parts participate, based on the value of a seed. Optionally, some degree of structure is imposed on the randomly generated packets. In one example, the imposed structure is achieved by dividing the data into sections and composing each packet only from data in a single section. Alternatively or additionally, the imposed structure comprises sending a plurality of different types of packets, for example, plain packets, packets interrelating different buckets (cross-bucket), packets interrelating cross-bucket packets, packet containing different numbers of blocks and/or packets using different mathematical techniques to combine blocks into packets.

In an exemplary embodiment of the invention, new needed packets are generated on demand, for example, as long as some receivers are still listening in to a stream generated by the transmitter.

An aspect of some embodiments of the invention relates to differential receiving and/or decoding of packets. In particular, in some embodiments of the invention, a client can differentially decode only data that it is missing using locally available "side" information, without the sender being aware of the content of the side information. Further, in some embodiments of the invention, the client is only required to receive a number of packets (any packets) corresponding to the amount of missing data (possibly plus a small overhead). For example, if a 100K file is being transmitted to N users, each of which has a different 80K of the file, any 20K (or even the same 20K) received from the transmitter is generally sufficient for the receiver to complete his file. In some exemplary embodiments of the invention, data which is previously decoded by the client and/or previously received packets are used to supplement the equations generated by the current packets. In a particular example, the side information may comprise a previously received WWW page or page frame, in an Internet setting.

An aspect of some embodiments of the invention relates to using a bucket scheme, in which packets of a data file are distributed between buckets (data structures representing parts of the file). Instead of forming one huge matrix representing all the equations, the equations are set up to each belong to one of a plurality of buckets, such that each bucket can be independently solved. The packets may be sent such that they fill the buckets evenly, however, this is not required. For example, the packets may be intentionally clustered for one or more buckets, so that the rate at which buckets fill up and can be solved is approximately constant, thus evening out CPU requirement. Such clustering may depend, for example, on the expected packet loss rate and/or distribution and/or packet reception rate.

In an exemplary embodiment of the invention, when a bucket is solved, the results of this solution are used to enhance the solution of other buckets. One way of transferring the results is to provide equations, for example as separate data packets, that link between buckets. In some cases, a cascade effect can be generated, where solving one bucket leads to generating equations for other buckets and solving them as well, even though not all the equations for each bucket were received. In some embodiments, an even higher dimension of buckets is used, for example including cross-cross buckets, which are formed by combining cross-packets.

Alternatively or additionally, within each bucket, any data elements that can be determined, are determined, so the equation set is made simpler and/or to support solving cross-bucket equations. Optionally, such solved elements are represented by rows that are removed from the bucket matrix, as solved. Optionally, such partial solving is only attempted once the bucket is nearly full, for example missing only 10 to 15 equations.

Alternatively or additionally, decoded data is stored in the buckets as well, thus mooting the need to store all of the buckets and all the decoded data. This is because, in some embodiments of the invention, only a small number of buckets is ready for solution at any one time.

Alternatively, data is sent without buckets. However, the actually received data may be clustered to form ad-hoc buckets, each of which may be solved separately. In particular, when most of the packets for a file are received, some of the equations can usually be solved. Optionally, cross-bucket packets are generated even if no real bucket structure is imposed, for example, for use in such ad-hoc buckets.

An aspect of some embodiments of the invention relates to unequal encoding of bits from the data file. In an exemplary embodiment of the invention, some parts of the data file participate more often in transmitted packets, thus making their earlier decoding more likely. Such a scheme can be used, for example for preferential transmission of important information or for bootstrapping information. Alternatively or additionally, a multi-level scheme can be used, for example, to support pyramid-type progressive reconstruction of images. Alternatively or additionally, a data bit is associated with a probability of selection that reflects its priority, thus enabling continuous priority setting. In an exemplary embodiment of the invention, the priorities for bit transmission are associated with an expected rate of playback, so that bits are decoded as they are needed for display.

An aspect of some embodiments of the invention relates to a method of selecting data blocks to participate in a data packet. Although, in some implementations, each data block has a 50% chance of being in any particular data packet. In an exemplary embodiment of the invention, the probability is much lower, for example, under 40%, 30%, 10% or even lower, for example less than 4% or 3%. In an exemplary embodiment of the invention, the probability is $100/2^N$ where N is a small integer, such as between 1 and 10. This reduced probability may result in a lower computational overhead when encoding and/or decoding received packets.

Optionally, at least some high probability packets and/or cross-packets(e.g., inclusion >40%, such as 50% or 90%) are sent as well as low probability packets. In some, embodiments, only two probabilities of inclusion are used. Alternatively or additionally, a greater number of probability levels are used, for example, even a semi-continuous range of probability. Optionally, the higher probability packets are used to reduce the waiting time for packets having missing bits when a bucket is nearly complete. In an exemplary embodiment of the invention, the packets with probabilities of over, for example, 60%, 70%, 80%, 90% or at any intermediate, smaller or greater percentage are selected with a frequency of over 0.5%, 1%, 3%, 10%, 20% or at any intermediate, smaller or greater percentage. Optionally, the selection frequency depends on the size of the bucket. Low probability packets are selected, for example at a frequency of above 50%, above 60%, above 80%, above 90% or at any intermediate, smaller or greater percentage An aspect of some embodiments of the invention relates to a universal encoder/decoder matching for FEC type codes. In an exemplary embodiment of the invention, a packet decoder can receive packets that are encoded using various parameters and/or a combination of different such packets and utilize all such packets in a same way to decode the data. For example, the decoding method can be independent of one or more of the block inclusion rate (possibly providing a method of identifying which blocks are included, is provided), rate of cross-bucket packet transmission, bucket size and preferential encoding of some bits or blocks.

One example of different types of packets comprises packets that encode only a single block (e.g., contain straight data) and packets that encode multiple blocks.

In a particular embodiment of the invention, the above described codes are used for multicasting data from a data server to clients, possibly the code being implemented by a system intermediate the server and the client, which system decides what data will be multicast and/or how it will be encoded.

In an exemplary embodiment of the invention, the data packets are generated by randomly selecting which data blocks will participate in each data packet. As a result, the repetition rate and the rate of receiving packets that are linear combinations of previous packets is expected to be low. In other embodiments, systematic methods of selecting blocks to participate in packets may be selected.

Thus, in a multicast system that continuously broadcasts the data, an effective data carousel is provided even though the same packets are not retransmitted. An advantage of random codes is that received information is less likely to repeat itself, thus reducing the probability of receiving the same data packet if the data is received in parts, at two or more different times.

There is thus provided in accordance with an exemplary embodiment of the invention, a method of encoding and transmitting data over a communication medium, comprising:

providing a file;
dividing said file into a plurality of buckets;
segmenting each bucket into a set of blocks;
selecting a subset of blocks from a bucket;
generating a packet by combining said selected blocks, such that an individual block cannot be reconstructed from a single packet;
repeating said selecting and said generating for a plurality of buckets and a plurality of packets;
generating at least one cross-bucket packet by combining blocks from different buckets; and
transmitting said generated packets and said generated cross-packets, said packets and said cross-packets being marked as such. Optionally, selecting said blocks comprises selecting fewer than 50% of the blocks in the bucket for said packet. Alternatively or additionally, transmitting comprises transmitting for each packet an indication of the blocks participating in said packet.

In an exemplary embodiment of the invention, the method comprises generating cross-cross-packets, which include contributions from multiple cross-bucket packets.

There is thus provided in accordance with an exemplary embodiment of the invention, a method of differential-decoding, comprising:

receiving and reconstructing at least a first part of a data file from a transmitter; and
determining data missing relative to said file;
receiving from a data stream transmitted independently of said missing data, substantially only enough data packets required to decode said missing data; and
reconstructing said missing data from said data packets, using said previously received first part of the file, wherein an identification of at least one of said received at least part of a file and said missing data is not known to said transmitter. Optionally, said data stream is transmitted to a plurality of receivers have different missing data. Alternatively or additionally, said data is encoded using a FEC (forward error correction) code. Alternatively or additionally, said reconstructing comprises reconstructing using data reconstructed from said part of a file. Alternatively or additionally, said reconstructing comprises reconstructing using data packets previously received for said part of a file.

In an exemplary embodiment of the invention, the method comprises generating said data stream for a plurality of different receivers with different missing data.

There is thus provided in accordance with an exemplary embodiment of the invention, a method of preferential encoding of data for transmission over a communication medium, comprising:

providing at least a portion of a file as a plurality of blocks;

selecting a subset of blocks from said file;

generating a packet by combining said blocks, such that an individual block cannot be reconstructed from a single packet; and repeating said selecting and said generating for a plurality of packets, wherein said blocks are selected in an uneven selection distribution, such that blocks with a higher priority are selected more often to take part in a packet. Optionally, said uneven distribution is substantially stepped, having fewer than five different selection probabilities. Alternatively, said uneven distribution is substantially continuous, having more than 5 different selection probabilities.

There is thus provided in accordance with an exemplary embodiment of the invention, a method of encoding data for transmission over a communication medium, comprising:

providing at least a portion of a file as a plurality of blocks;

selecting a subset of said blocks;

generating a packet by combining said blocks, such that an individual block cannot be reconstructed from a single packet;

transmitting said packet over an open channel;

repeating said selecting, said generating and said transmitting as long as said channel is open and after at least twice as many packets as required for reconstructing the file are transmitted. Optionally, said repetition continues for after at least 10 times the required number of packets are transmitted. Alternatively or additionally, said repetition continues for after at least 50 times the required number of packets are transmitted. Alternatively or additionally, said selecting comprises randomly selecting. Alternatively or additionally, said selecting comprises selecting said subset to include fewer than 50% of said blocks.

In an exemplary embodiment of the invention, said transmitted packets define a set of over-constrained equations without a single unique solution.

In an exemplary embodiment of the invention, the method comprises maintaining said channel as open as long as there exists a requester for said file.

There is thus provided in accordance with an exemplary embodiment of the invention, a method of encoding data for transmission over a communication medium, comprising:

providing at least a portion of a file as a plurality of blocks;

randomly selecting a subset of said blocks, said selecting comprising selecting a block at a probability of other than 50%;

generating a packet by combining said blocks, such that an individual block cannot be reconstructed from a single packet; and repeating said selecting and said generating for a plurality of packets. Optionally, said probability is above 60% for at least 2% of said blocks. Alternatively or additionally, said probability is below 40% for at least 80% of said blocks. Alternatively or additionally, said probability is below 20% for at least 80% of said blocks. Alternatively or additionally, said probability is below 10% for at least 80% of said blocks. Alternatively or additionally, said probability is below 5% for at least 80% of said blocks. Alternatively or additionally, said probability is below 45% for some packets and above 45% for other packets.

There is thus provided in accordance with an exemplary embodiment of the invention, a method of decoding, comprising:

receiving a plurality of packets encoding a data file;

setting up, in a memory, a set of equations whose solution represents the data file, based on a content of said packets; and solving only some of said equations before receiving sufficient packets for setting up all the equations required to determine said data file, to reconstruct a portion of said data file.

Optionally, the method comprises displaying at least part of said reconstructed portion, prior to receiving said sufficient packets. Alternatively or additionally, the method comprises storing at least part of said reconstructed portions in the place of said solved equations. Alternatively or additionally, each of said packets is not limited to include contributions from only part of said data file. Alternatively or additionally, the method comprises attempting to solve said equations to determine if at least some of said equations can be solved. Alternatively or additionally, the method comprises attempting to solve said equations only after a certain percentage of said sufficient packets are received.

In an exemplary embodiment of the invention, the method comprises utilizing equations defined between groups of packets for said solving.

There is thus provided in accordance with an exemplary embodiment of the invention, a method of transmitting information, comprising:

providing at least a portion of a file as a plurality of blocks;

selecting a subset of said blocks;

generating a packet by combining said blocks, such that an individual block cannot be reconstructed from a single packet, said packets varying in an a-priori probability of a block being selected for inclusion in a packet.

transmitting said packet;

repeating said selecting, said generating and said transmitting for a plurality of packets;

receiving at least some of said packets; and reconstructing said at least a portion of the file from said received packets. Optionally, said variation is unknown to said receiver. Alternatively or additionally, said variation represents division into buckets. Alternatively or additionally, said variation represents preferential encoding. Alternatively or additionally, said variation represents changes in block selection probability per packet. Alternatively or additionally, said variation represents providing a cross-bucket packet rather than a regular packet.

In an exemplary embodiment of the invention, combining comprises adding modulo a field size. Optionally, said field size is 2 for at least some of the packets. Alternatively or additionally, said field size is greater than 2 for at least some of the packets. Alternatively, said field size is greater than 2 only for some of the packets.

There is thus provided in accordance with an exemplary embodiment of the invention, a method of storing information on a storage media, comprising:

determining an expected error rate on said storage media;

encoding a data file to be stored as a plurality of FEC (forward error correction) coded packets, including:

selecting a number of packets required to overcome said error rate; and         generating said number of packets;

writing said packets to said storage media. Optionally, said generating comprises generating by randomly selecting blocks of said data file to be included in packets.

BRIEF DESCRIPTION OF THE DRAWINGS

Non-limiting exemplary embodiments of the present invention will now be described in the following detailed description, with reference to the attached drawings, in which.

DETAILED DESCRIPTION OF EXEMPLARY EMBODIMENTS

Figure 1:
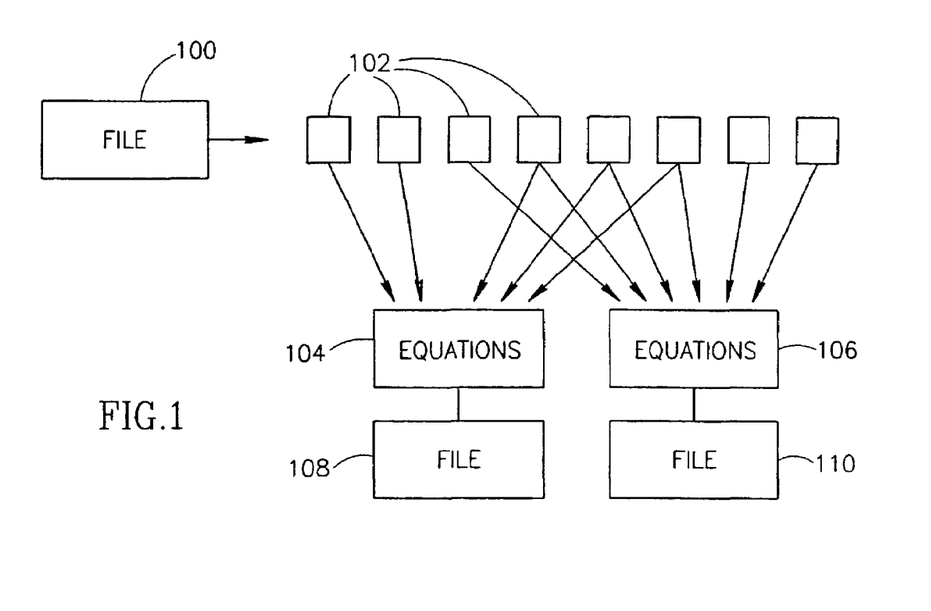
FIG. 1 is a schematic illustration showing an original data file encoded into a set of packets and decoded back into a data file, in accordance with an exemplary embodiment of the invention.

FIG. 1 is a schematic illustration showing an original data file 100 encoded into a set of packets 102 and decoded back into a data file (108 or 110), in accordance with an exemplary embodiment of the invention.

Figure 2:
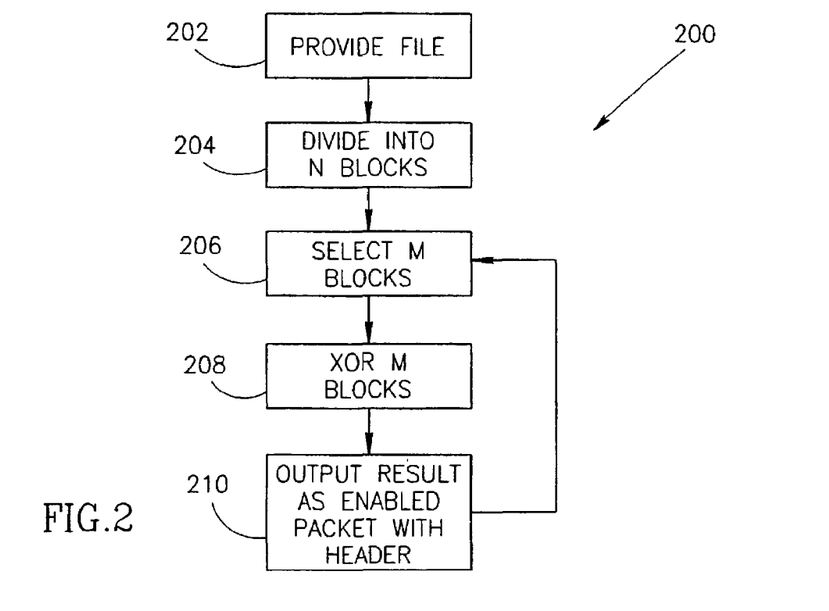
FIG. 2 is a flowchart of a method of encoding, in accordance with an exemplary embodiment of the invention.

FIG. 2 is a flowchart of a method 200 of encoding, in accordance with an exemplary embodiment of the invention. At 202, file 100 is provided. At 204, the file is divided into a plurality of N blocks. Possibly, the size of each block is the same as (or, in some cases, smaller than or larger than) the target packet size, to match anticipated communication needs. Alternatively, other block sizes may be used, possibly blocks as small as a single bit. By using an expanding code (e.g., each source bit being transmitted as more than one bit), the effective block size can also be made smaller than one bit.

At 206, a subset of M blocks is selected from the available blocks for combination into a single packet. Optionally, more than one packet may be generated from the subset, for example, using different combination functions for the different packets. In an exemplary embodiment of the invention, the subset is selected using a randomization function, optionally using a known seed. Alternatively or additionally, a different selection method may be used, for example a deterministic method. The present inventors have determined that even with a random selection, the generated packets are very unlikely to repeat, as will be described below. Optionally, the seed is transmitted with the packet. Alternatively, a more direct indication, e.g., a string of bits, may be used.

At 208, the blocks are combined, for example using a XOR function, that XORs individual bits from the blocks. However, a higher mathematical field can be used, in which, for example, an addition function can be used as a combination function. In some embodiments of the invention, some of the packets are generated using a lower field and some using a higher field. In some embodiments, using higher field packets results in a lower overhead and a possibly higher CPU requirement for decoding.

The result of the XORing is outputted as a packet (optionally with a suitable header) at 210. Additional packets are generated by repeating steps 206-210.

It is a particular property of the above code, at least in some implementations thereof, that a very large number of different packets can be generated. The original data file can be reconstructed from any subset of the generated packets, providing that the number of accumulated packets is at least the same as the number of blocks N. In some cases and/or embodiments, a small overhead, possibly equal to zero, in terms of number of packets, is also required.

Figure 3A:
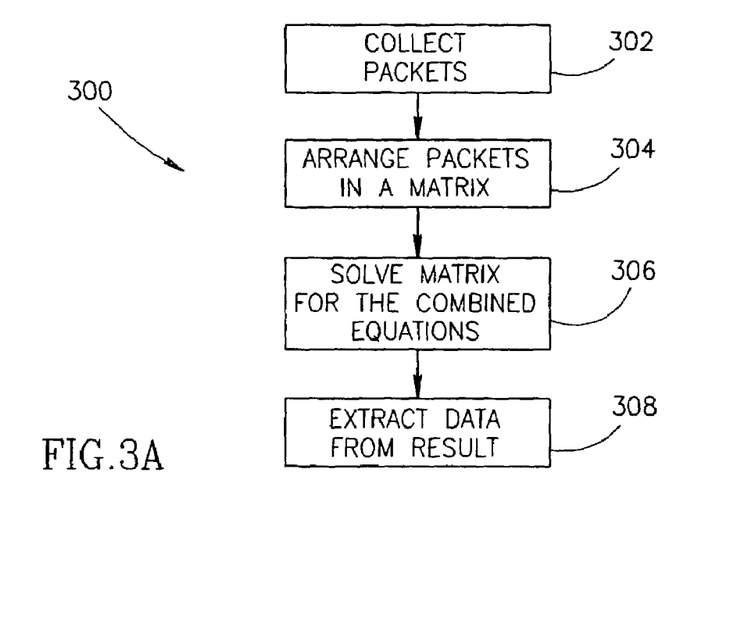
FIG. 3A is a flowchart of a method of decoding, in accordance with an exemplary embodiment of the invention.

FIG. 3A is a flowchart of a method 300 of decoding, in accordance with an exemplary embodiment of the invention. At 302, a plurality of packets from the output of FIG. 2, are collected. As noted above, not all the packets need to be collected. Alternatively or additionally, the order of collection is not crucial, in some embodiments of the invention.

Figure 3B:
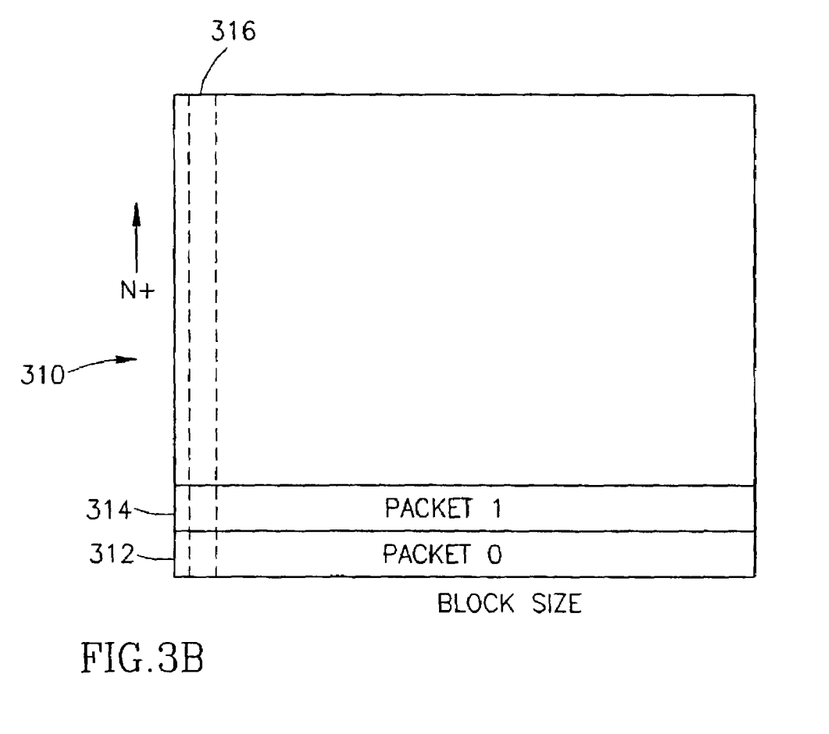
FIG. 3B shows a packet matrix for decoding, in accordance with an exemplary embodiment of the invention.

At 304, the collected packets are arranged in a packet matrix. FIG. 3B shows a packet matrix 310, in accordance with an exemplary embodiment of the invention. In an exemplary embodiment of the invention, matrix 310 has a width of a packet (e.g., a block size), and a height of at least N, the number of packets collected. In alternative embodiments, the matrix may be narrower or taller and/or shorter or wider, for example as described below. In one example, only some of the data from each packet is decoded, so the matrix is made smaller than a packet. In another example, different bits in a packet are provided at different frequencies, for example, the packets may include overlapping bits.

As shown, each packet is inserted in the matrix as a row, for example rows 312 and 314. The columns (e.g., a column 316) represent bit positions in the packets.

At 306 (FIG. 3A), a set of equations representing the combination of the bits in the original blocks, is solved. This set of equations can be determined, for example, from an identification of the blocks that were used to form each packet. In an exemplary embodiment of the invention, only a seed is provided with each packet, and by repeatedly applying a random number generator to the seed, a list of the blocks combined to form the packet is generated.

In one exemplary solution method, matrix 310 is inverted and then multiplied by a matrix representing the equations, to yield a solution matrix. Alternatively other equation solution methods, for example, a Gauss elimination process, may be used. In some implementations, different receivers will collect different packets. Thus the equation sets 104 and 106 (FIG. 1) may vary, even for a same data file and transmission.

At 308, data files 108 and 110 (FIG. 1) are extracted from the matrix.

In a random selection implementation of 206 (FIG. 2), the blocks may be selected, for forming a packet, using a seed-based random number function, in which each block has an even chance of being selected each time. Alternatively, non-even chances may be used, for example, a greater than even chance for selection, such as 75%, 85% or higher, or a smaller than even chance of selection, such as less than 30%, 20% or even less than 10%. It is expected that when the chance of selection is made smaller, the danger of generating two redundant packets is greater. Conversely, the encoding and/or decoding processes may be made more efficient. In some implementations of the invention, as long as M is large enough, e.g., at least 10 or 20, the overhead in terms of redundant packets is vanishing small, possibly substantially independent of N.

In some embodiments of the invention a trade-off can be selected between the increased efficiency of calculation and the increased chance of receiving redundant packets.

Figure 4A:
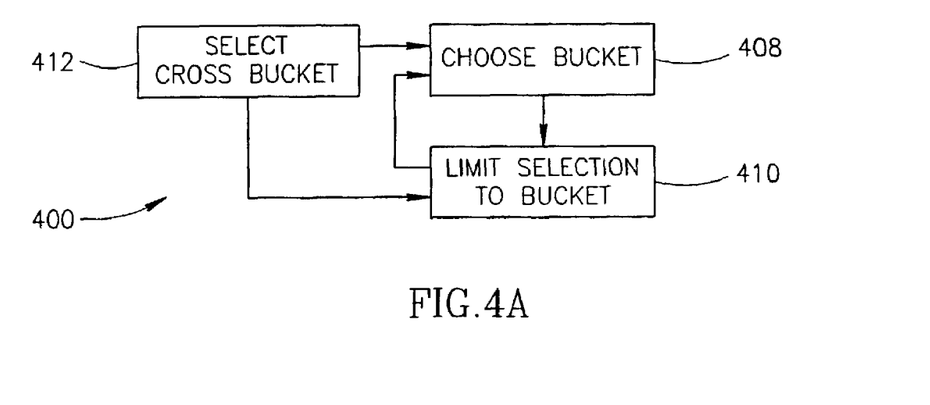
FIG. 4A is a flowchart of a method of block selection for a bucket based encoding method in accordance with an exemplary embodiment of the invention.

FIG. 4A is a flowchart 400 of a method of block selection for a bucket-based encoding method in accordance with an exemplary embodiment of the invention. One potential drawback of the method described with reference to FIGS. 1-3, is that a large memory is required for storing matrix 310 (e.g., typically most or all the received packets) and/or inverting the matrix is very computationally expensive. In bucket based encoding method, a large file is partitioned into a plurality of sections, "buckets". Sets of packets are created for each bucket, for example using the method described above, so that each bucket can be solved independently of the other buckets, once enough ($N_1$) packets are received for that bucket. In some cases, at least one bucket will be decoded before N packets (required for decoding a complete file) are received. Although buckets are preferably all the same size, in some embodiments, some buckets may be larger or smaller than other buckets, for example to control the rate of bucket filling. The computational complexity and/or algorithmic complexity may be optimal when equal sized buckets are used.

As shown in FIG. 4A, during encoding, the selection (206) of FIG. 2, comprising choosing a bucket (408) and limiting the selection of blocks to the bucket (410). Additional step 412 will be described below.

Figure 4B:
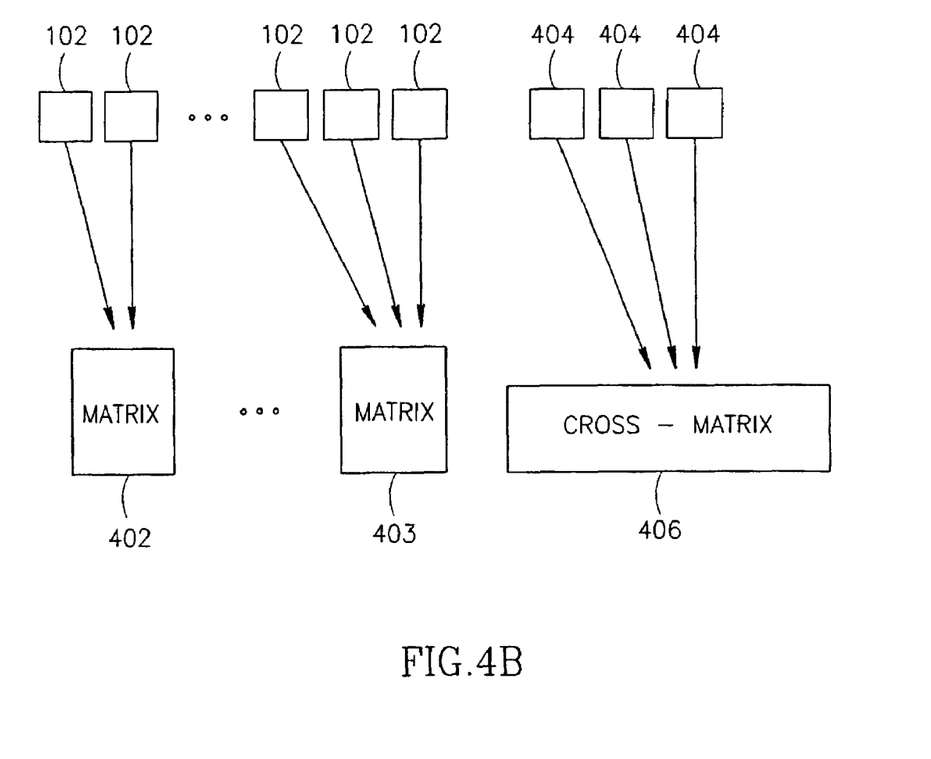
FIG. 4B shows a plurality of packet types and matrices, for a bucket based decoding method in accordance with an exemplary embodiment of the invention.

FIG. 4B shows the association of packets and matrices, for a bucket based decoding method in accordance with an exemplary embodiment of the invention. Some packets 102 are associated with a matrix 402 of a first bucket and some with a matrix 403 of a second bucket. Packet 404 and matrix 406 will be described below.

Figure 5:
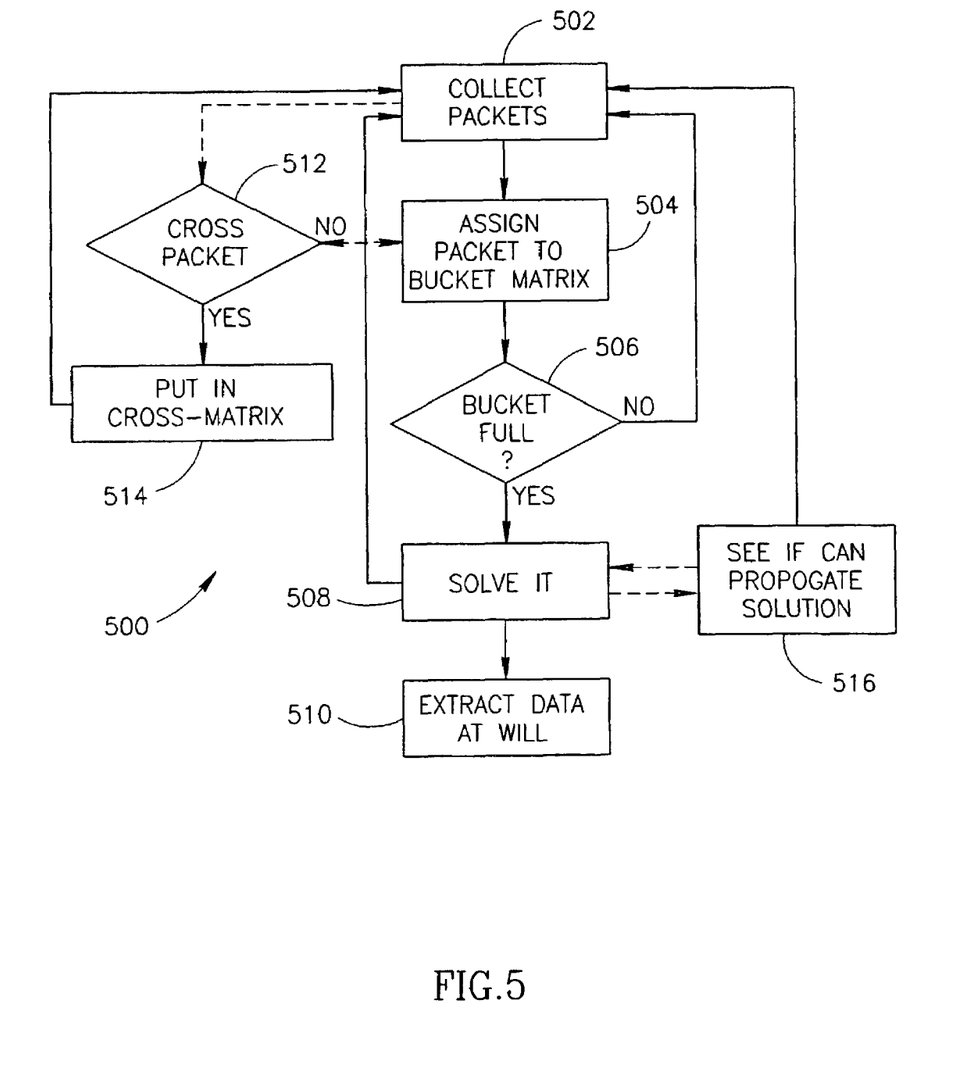
FIG. 5 is a flowchart of a method of bucket decoding, in accordance with an exemplary embodiment of the invention.

FIG. 5 is a flowchart 500 of a method of bucket decoding, in accordance with an exemplary embodiment of the invention. At 502 and 504, packets are collected and assigned to a particular packet matrix which is associated with the bucket with which the packets are associated. It should be noted that some packets may be lost during transmission. Also, the reception rate may be lower than the transmission rate. Also, the transmission and reception may not be in phase.

If a bucket is full (e.g., the matrix can be inverted) (506), the bucket is solved (508). As data is now available, it may be extracted at once, when needed, or provided when all the buckets are decoded.

The selection (FIG. 4A) of the distribution of packets between packets and the statistics or reception of packets by a receiver can determine which packet is solved first. In an exemplary embodiment of the invention, the selection may be determined based on an expected reception profile, for example, $N_1+3$ packets sent for the first bucket and then for each bucket in the series. Thus, the last bucket will only fill up after all the packets are received. If more than 3 packets are missed for the first bucket, a very long wait until a suitable packet is available may be required. Alternatively, packets for different buckets may be alternated. Possibly, the order of packet generation, alternatively or additionally to the probability of selecting a bit for a packet, are used to determine which bucket will fill up sooner, for example in order to even out CPU usage or to allow data from a particular bucket to be displayed ahead of data from other buckets.

As can be appreciated, the above bucket scheme may require a very long wait until all the buckets are full. Further, once most of the buckets are full, many of the received packets are redundant, and can be ignored (or even rejected at the receiver).

In an exemplary embodiment of the invention, additional cross-bucket packets are provided (indicated as 404 in FIG. 4B), which include information that links between equations of different buckets, by providing cross-equations. In many cases, an avalanche effect can be realized, in which a solved bucket can prompt the solution of cross-equations and thus the solution of other buckets.

In an exemplary embodiment of the invention, a cross-packet is generated by XORing together a plurality of blocks, which blocks are associated with at least two buckets. Possibly, a cross-packet is generated by XORing together many or all the blocks that constitute two or more buckets, however, in some embodiments, only a small number of blocks is selected from each bucket, for example, one or two. The selection of these blocks and/or of the buckets may be, for example, random, based on preferential encoding considerations, and/or based on a predetermined selection method, for example to ensure exhaustive coverage of all the buckets. Each such cross-bucket packets, once completely or partially solved, can be used to add an equation to unsolved buckets.

As shown in FIG. 4B, a cross-packet 404 is directed to a special cross matrix 406. In the method 400 of FIG. 4A, an additional step 412 of selecting a cross-bucket is provided so that periodically, a cross-packet will be generated.

In the decoding process, of FIG. 5, at 512, the existence of a cross-packet is determined, in which case it is put in cross-matrix 406. When a bucket (or the cross-matrix) is partially or completely solved (508), a check is made to see if the solution (or partial solution) can be propagated to other buckets (516) or the cross-matrix.

Many different types of cross-packets can be used. Also, a plurality of different types of cross-packets can be provided in a single encoding session. In some embodiments of the invention, the ratio of cross-packets to regular packets is maintained to be low, for example less than 10%, less than 5%, about 2% or even 1% or less. Alternatively, a higher ratio of cross-packets may be provided, for example, 30% or more.

Cross-packets can have one or more of the following properties:

(a) Size. Cross-packets can be larger, smaller or the same length as standard packets.

(b) Combination type. A cross-packet can be a XOR of packets from different buckets (e.g., the selection size M for a cross-packet may be different for that of a bucket-packet. In some embodiments, different buckets may have different selection sizes $M_i$).

(c) Ordinality. A single cross-bucket can include data from more than one packet of each bucket. In some cases, it may be desirable to use a higher field, such as an 8 bit field, so, for example, combination of packets is by addition rather than by simple XOR.

(d) Completeness. In some embodiments, a cross-packet includes all the bits from each constituting packet. Alternatively, it may include fewer than all the bits in at least some of its constituting packets.

(e) Extent, e.g., the number of buckets that contribute to a cross-packet. In some embodiments of the invention a trade-off is realized between the number of buckets and the expected time to achieve an avalanche effect. If the number of buckets is smaller, propagation of solutions between buckets becomes likely after receiving a relatively small number of packets. Conversely, if the number of buckets is larger, a bucket with missing equations is more likely to have equations from a cross-packet. Exemplary numbers of buckets are between 5 and 10 buckets per cross-packet. It is noted that the selection of buckets for cross-packets can also follow various distribution rules, including both even and uneven distributions.

It should be noted that even within a bucket (or in bucket-free systems), in many cases at least some of the equations can be solved for example once the bucket is nearly full. The decision to try and (partially) solve the bucket may depend for example on its fill level, e.g., once it is 80% full or once only fewer than a predetermined number of packets (e.g., 10 or 15) are missing. Alternatively or additionally, attempts to solve the bucket may be initiated at any time and/or periodically. The attempts may, for example, increase in frequency as more data is received and/or buckets fill up. The solution of the cross-packets may be prompted by the availability of all the data required for solving the cross-packet, for example if all but one of the constituting buckets are solved.

In an exemplary embodiment of the invention, the partial solution of buckets is used to provide partial display, when reconstructing images or other graphical information, to start presenting the received file, prior to complete decoding thereof.

The above description has focused on a one-dimensional implementation (single matrix) or a two dimensional implantation (cross-packets of one or more types). In an exemplary embodiment of the invention more than two dimensions may be provided, for example by providing cross-cross-packets that can be used to regenerate cross-packets that are not received.

Alternatively or additionally, to periodically providing cross-packets, particular types of cross-packets may be provided after a time at which it is estimated that one or more receivers of the packets may find them of use, for example based on receiver and noise statistics and/or based on feedback from the receivers. Alternatively, an even distribution may be provided. Alternatively or additionally, the partitioning of the original data file into buckets may be changed over time.

Figure 6:
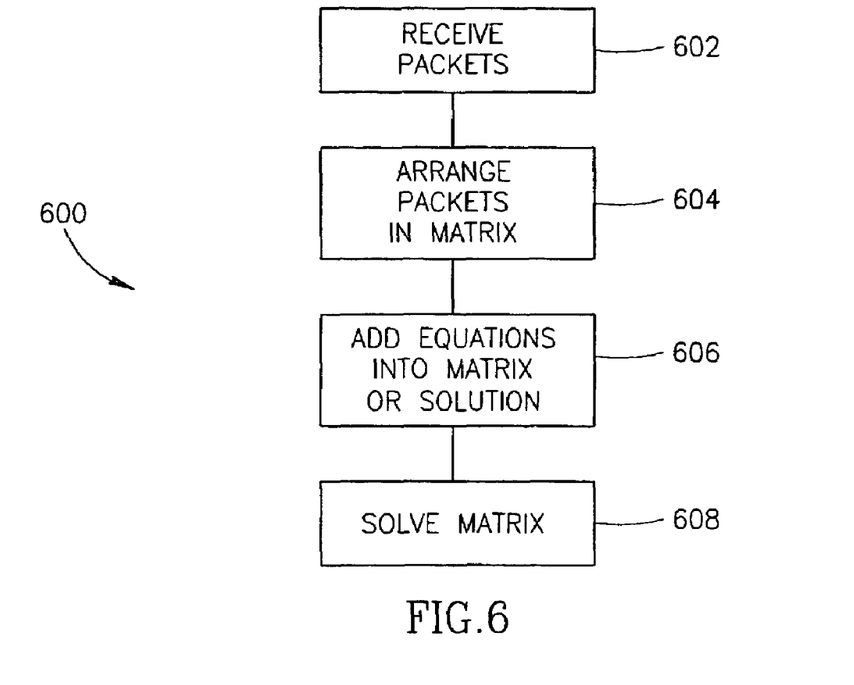
FIG. 6 is a flowchart of a method of differential decoding, in accordance with an exemplary embodiment of the invention.

FIG. 6 is a flowchart 600 of a method of differential deciding, in accordance with an exemplary embodiment of the invention. In differential decoding, portions of file 100 that reside at the receiver ("side information"), are used by the receiver to decode incoming packets, even if fewer than N packets arrive. In an exemplary embodiment of the invention, the transmitter (encoder) is not aware what portions of file 100 are available at the receiver. In some embodiments of the invention, the efficiency of utilization of such portions is 100%, i.e., every previously known bit provides one bit in the result, so only a number of packets corresponding to the missing information (possibly plus a small overhead), need to be received and decoded. Optionally, the data is decoded in full blocks, so that even if less than a complete block is missing, a complete packet is received and used to solve the missing data as part of a complete block.

At 602, packets are received. The packets are arranged in one or more matrices (604). The available side information is now incorporated in to the acquired packets (606), so that the matrix can be solved (608). In an exemplary embodiment of the invention, the side information is provided as data. Alternatively or additionally, it may comprise previously acquired packets. One exemplary method of incorporation is forming new pseudo packets from the side information and adding them to the buckets (e.g., as equations), or forming and using them as cross-packets. Another exemplary method of incorporation comprises inverting the matrix and incorporating the data in the solution, for example by into the inverted matrix or as known solved bits in a Gauss elimination solution method.

Although the transmitter is not required to know in advance what side information is available, if the transmitter has such knowledge, more efficient updates can be sent. Such knowledge may be available, for example by feedback form the receivers, or by the transmitter keeping track of previously sent information, which is expected to be available at the receivers. The increased efficiency of updates may take the form of sending only the information which is missing, or sending the information so that some of it can be decoded faster using the side information that is expected to be available.

In an exemplary application, a WWW page is decoded using a known frame or menu portion of the page as side information. Such differential decoding may also be used to provide personalized WWW multicasting, by each receiver decoding only the parts of the broadcast that carry information that they require.

Figure 7:
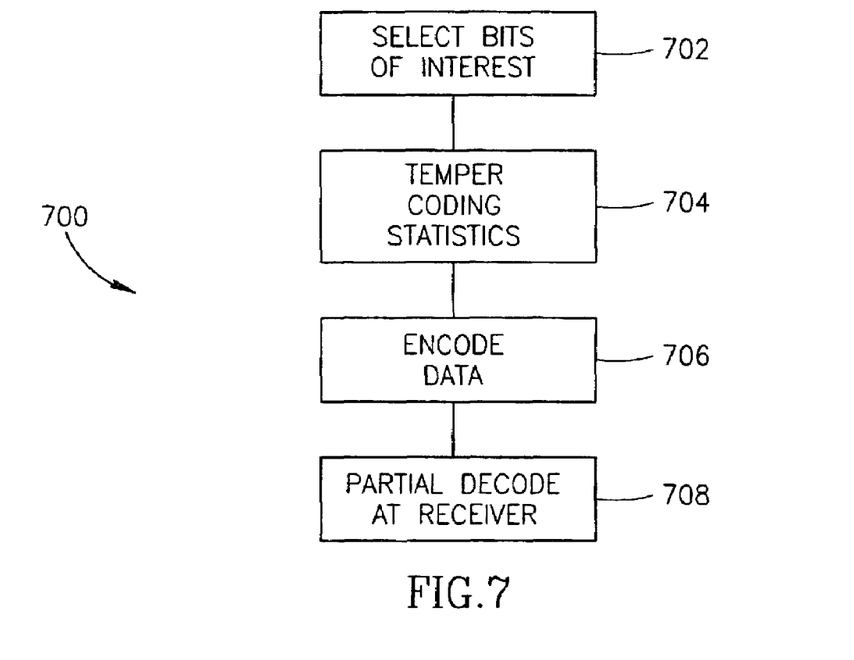
FIG. 7 is a flowchart of a method of preferential encoding and decoding, in accordance with an exemplary embodiment of the invention.

FIG. 7 is a flowchart 700 of a method of preferential encoding and decoding, in accordance with an exemplary embodiment of the invention. At 702, those bits of file 100 that are of interest are selected, for example, based on them being more important or it being desirable to decode them earlier, for example for earlier display. At 704, the statistics and/or various parameters of the encoding process are changed at the transmitter and/or the receiver. The changed parameters may be transmitted, for example, with the packets, or as a separate transmission. At 706, the data is preferentially encoded. When the data is received at a receiver, at 708, the preferentially encoded data is partially decoded before the rest of file 100 is decoded.

Various method of preferential encoding may be used. In one method, bits of interest are selected for generating packets more often than plain bits. In one example, a packet is generated from the same number of source blocks, except that the blocks are selected so that some have a higher probability. Alternatively or additionally, a larger number of blocks may be used for a packet, with the additional blocks beings selected from those having a higher priority.

It is noted that whole blocks can be treated as being preferential or even individual bits in a block. In an exemplary embodiment of the invention, some packets are constructed from selected bits from preferred blocks. Such bits may be XORed with the same position bits in other blocks or with any bit that is being transmitted. A description of the arrangement of the bits in the packet may be provided as part of the packet or may be, for example, preset and indicated using prearranged symbols. In another method, buckets for preferred data blocks are smaller. Alternatively or additionally, packets for such buckets appear more often in cross-packets.

In an exemplary embodiment of the invention, only one level of preference is provided. Alternatively, more than one level, or even a continuum of preference levels is provided. For example, the probability of a packet being in a cross-packet may vary as a function of the "importance" of the bits in the packets included in the cross-packet. In another example, more equations are provided for buckets of interest. In another example, a bit may be repeated several times.

In an exemplary embodiment of the invention, preferential encoding of data is used for streaming applications. In an exemplary embodiment of the invention, as data blocks are displayed in a certain order, the blocks are preferentially (and/or otherwise) encoded and transmitted so that those blocks that are shown earlier can be decoded earlier.

The following is a formula describing limitations on setting multiple priority levels using preferential encoding and/or transmission:

$$\sum_{i=1}^{i=k} \frac{\alpha_i}{\beta_i} \leq 1,$$

where k is the number of priority levels, $\alpha_i$ is the fraction of the data at priority level i and $\beta_i$ is the number of packets required to be received from the preferentially encoded stream in order to reconstruct the data at that priority level (normalized by the total number of packets in the original data). Thus $\beta_i$ represents the priority of the level, a smaller value corresponds to higher priority.

Additional details may be found in the above referenced related patent applications.

Transmitting the information using an encoding scheme as described above may mandate some overhead over what would be required for non-encoded data. The overhead can be one or more of CPU (for encoding and decoding), memory (for storing packets and/or intermediate data), communication bandwidth (for redundant packets) and/or time (various delays). In some exemplary embodiments of the invention, the degree of overhead is reduced and/or various trade-offs are possible between different encoding parameters.

With regard to bandwidth overhead, the present inventors have found that even if the selection of blocks for packets is randomized, rather than systematic, the expected number of redundant packets can be quite small, for example, 5, 3, 2, or even 1.6 packets, or less. This number can be substantially independent of the file size, meaning that for large files, the overhead is vanishing small. The use of cross-packets may require an overhead that is a small fraction of the transmission, for example, less than 5%, 2% or even 1%. In general however, larger overheads can be used, and might allow lower CPU and/or memory requirements.

CPU for encoding and/or decoding may be reduced, for example, by selecting only a small number of blocks for each packet. If this number is sufficiently high, for example greater than 10 or a sufficiently high percentage, for example, greater than 5% or 10% of the total, the bandwidth overhead is not substantially increased, while the CPU requirements are decreased. In an exemplary embodiment of the invention, if a probability of S% is used for selecting a packet, the overhead at the encoder can be reduced by as much as approximately 100/S and the overhead at the decoder can be reduced by as much as approximately (100/S+0.5)/2. Using cross-packets and/or buckets allows the solving process to continue while packets are being received, allowing CPU needs to be evened out.

One optional method of reducing memory requirements is to store blocks, as they are decoded in the same memory space used for storing received packets. Another method is to transmit the data such that data which is used sooner can be decoded sooner, so that after it is decoded it can be used and dropped.

With regard to time and space considerations, it should be noted that a file may be expanded in size during encoding to any degree desirable, by generating any number of packets desirable. The resulting train of packets may contain very few repetitions, so, in some embodiments of the invention the probability of receiving a redundant packet is lower.

In an exemplary embodiment of the invention, the encoding method is adapted to the actual situation. For example, depending on the noise level, the number of cross-packets may be increased, to compensate for lost packets. Alternatively or additionally, the distribution of blocks being used for packet generation may be adapted to match a reception profile at one or more particular receivers.

The above described correction code is generally inherently corrective for errors of packet omission. Alternatively or additionally, packet errors can also be corrected, rather than dropping a packet. In one example, a bucket is solved using an over-constrained set of equations, representing extra received packets.

Alternatively or additionally, an under-constrained bucket may be solved to yield one of a set of possible results, a particular element of which set may be substituted for the real data until it arrives, for example in an image. In some embodiments of the invention, a display program, such as a browser is integrated with the receiver, to allow the data to be updated as it evolves.

In an exemplary embodiment of the invention, significant bits of the image are selected, to be more likely to be correctly decoded in under-constrained buckets. For example, such bits may be selected more often to take part in a packet. Exemplary significant bits are low frequency bits.

Some exemplary embodiments of the invention provide a method of limiting access to the transmitted data. In an exemplary embodiment of the invention, the data is encrypted, for example using a public key encryption method, prior to being transmitted. Optionally, only some of the packets are encrypted, allowing a potential customer to receive the data at a lower rate, for example for checking to see if the service is of interest or to allow several levels of service to be provided. In an exemplary embodiment of the invention, a file is multicast using multiple streams, with some of the streams being encrypted, so only a paying customer can decode a complete file and/or can decode it faster than non-paying customers. Each of the streams may include, for example, a different level of detail, so only paying customers can perfect reception. In an exemplary embodiment of the invention, only cross-packets are encrypted, allowing non-avalanche type reconstruction. It should be noted that merely failing to provide the seed used for packet generation, may render an available packet useless, thus effectively encrypting the packet. In some embodiments of the invention, only paying customers received a "seed" channel, which may be, for example, synchronized to the other transmission channels.

Alternatively or additionally, side information available at a paying customer is used to decode the information. Alternatively or additionally, a data file is sent with a significant number of "junk" packets, which may actually contain information (e.g., for other channels), but that slow down data reception for a non-authorized receiver.

The above description has focused on packet based transmission systems. However, packets are not required for the implementation of the above methods. A packet based system will, for example, use a packet including an identification of the packet contents, a seed used to generate the packet.

Alternatively, the data may be sent as bits, with each bit representing, for example, the combination of a plurality of bits from the file. In an exemplary embodiment of the invention, an index associating transmitted bits with file locations and/or with blocks (1 bit size) used for bit generation, are provided as a separate packet. Alternatively or additionally, such information is provided in a separate channel. Alternatively or additionally, the information is encoded at the start, and/or repetitively during transmission, in a manner which is easy to decode, for example as unended information, with a special synchronization pattern, such as a series of known bit numbers and/or a checksum. Alternatively or additionally, the information is provided as a single seed, which can be used to decode the information provided an exact timing is used. In some embodiments of the invention, a single seed and/or synchronization stream is used for a plurality of channels and/or packet streams. Alternatively or additionally, the seed and/or a synchronization signal may be periodically sent.

It should be noted that the above decoding method is not limited to data file transmission. It may also be usefully applied to other applications, for example, data streaming, in which a stream is broken into parts, possibly of non-equal sizes, for example, having a size ratio between packets. Each part can be reconstructed from the received packets, as soon as a sufficient number are received. Optionally, a plurality of blocks are multicast in parallel, and received in parallel, allowing the reception and decoding to continue in parallel with the displaying of previous file parts.

In an exemplary embodiment of the invention, the above coding method is used for emulating an HTTP connection. A multicasting server retrieves data from one or more Internet data servers and multicast the data which is most commonly accessed to client computers. By using the above coding method, differential decoding allow efficient data retrieval by the clients and/or personalization by retrieving only personalized portions of the data, in some implementations. Alternatively or additionally, the data rate of the receiver can be lower than that of the transmitter. Important information, for example a bootstrapping program for the client, may be transmitted using preferential encoding. In an exemplary embodiment of the invention, the server emulates an HTTP connection from the clients to the Internet data server. Possibly, the decision which data is multicast, and which unicast is dependent on usage statistic accumulated by the multicasting server.

In another application, the above coding methods are used for providing dependable storage, such that if only a small part of the stored packets are lost, the data can still be reconstructed. Preferential encoding can be used to guarantee some data over other data. Alternatively or additionally, differential decoding is used to retrieve only the required data. In an exemplary implementation of the invention a storage device can transparently add a certain percentage of overhead to any or all data stored on the device thus allowing reconstruction of the data even if a limited amount of errors develop anywhere in the stored data. (e.g. a bad sector on a disk).

In an exemplary embodiment of the invention, when a disk is used, an a-priori determination is made of allowed bad-sectors in the disk. This rate is used in determining the number of extra packets that need to be written, to guarantee survival of data (at some probability level). The rate may be different for different file sand/or change as the disk ages. Optionally, a group of files are collated into a content group that is encoded together to the disk.

In an exemplary embodiment of the invention the transmitted packets contain overhead information to check for errors and/or to speed up decoding. The information added can, for example, comprise of protocol information, coding dependent overhead, a hash value, a random seed and/or a string of bits representing the numbers of the blocks participating in the packet.

In an exemplary embodiment of the invention, the following encoding parameters are used. These encoding parameters describe an exemplary implementation and other values may be selected for other implementations. A packet size is 576 bytes of which either 505 or 524 bytes are data. The rest of the packet is overhead, some protocol overhead and some, coding dependent overhead, 16 or 36 bytes, describing, for example, the contents of the packet, a hash value of the original file and/or the seed.

If a file is under 1024 packets long, only one bucket is used. If the file is longer, a maximum bucket size of 512 packets is selected, for example. The file may be evenly divided between the buckets or all the buckets are full and the last one is partial. Other division methods may be used as well.

An exemplary method of packet selection is to randomly select a starting bucket and then send a series of packets, one for each bucket, starting at the starting buckets. Then the process is repeated for another starting point. This method may overcome some types of periodic noise, while maintaining a relatively even distribution or packets between buckets. Possibly, a block is selected with a probability of $1/32$ to take part in a packet.

In an exemplary embodiment of the invention, 1% of the packets are cross-bucket packets. If there are fewer than 10 buckets, 50% of the buckets are selected to take part in across-packet. If there are over 10, no more than 5 buckets are selected. This may increase the probability of solving an equations posed by a cross-bucket packet, by substitution. Optionally, all cross-bucket packets include a same number of originating buckets. The block selected to take part in the cross-bucket packet may be the same position block in all the buckets, for example, the 3rd. this block position may be selected randomly.

In an exemplary application of differential decoding, only information for whole packets is used, for example to simplify the implementation. However, this is not required and partial packets may also be decoded.

The present invention has been described using non-limiting detailed descriptions of embodiments thereof that are provided by way of example and are not intended to limit the scope of the invention. It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art.

It is noted that some of the above described embodiments may describe the best mode contemplated by the inventors and therefore include structure, acts or details of structures and acts that may not be essential to the invention and which are described as examples. Structure and acts described herein are replaceable by equivalents which perform the same function, even if the structure or acts are different, as known in the art. In particular, various trade-offs between coding and decoding efficiency parameters may be implemented, and the method may be optimized for a specific application. Therefore, the scope of the invention is limited only by the elements and limitations as used in the claims. When used in the following claims, the terms "comprise", "include", "have" and their conjugates mean "including but not limited to".

The invention claimed is:

1. A method of encoding and transmitting data over a communication medium, comprising:
   providing a file;
   dividing said file into a plurality of buckets;
   segmenting each bucket into a Set of blocks;
   selecting a subset of blocks from a bucket;
   generating a packet by combining said selected blocks, such that an individual block cannot be reconstructed from a single packet;
   repeating said selecting and said generating for a plurality of buckets and a plurality of packets;
   generating at least one cross-bucket packet by combining blocks from different buckets; and
   transmitting said generated packets and said generated cross-packets, said packets and said cross-packets being marked as such.

2. A method according to claim 1, wherein selecting said blocks comprises selecting fewer than 50% of the blocks in the bucket for said packet.

3. A method according to claim 1, wherein transmitting comprises transmitting for each packet an indication of the blocks participating in said packet.

4. A method according to claim 1, comprising generating cross-cross-packets, which include contributions from multiple cross-bucket packets.

5. A method according to claim 1, wherein combining comprises adding modulo a field size.

6. A method according to claim 5, wherein said field size is 2 for at least some of the packets.

7. A method according to claim 5, wherein said field size is greater than 2 for at least some of the packets.

8. A method according to claim 5, wherein said field size is greater than, 2 only for some of the packets.

9. A method of preferential encoding of data for transmission over communication medium, comprising:
   providing at least a portion of a file as a plurality of blocks;
   selecting a subset of blocks from said file;
   generating a packet by combining said blocks, such that an individual block cannot be reconstructed from a single packet; and
   repeating said selecting and said generating for a plurality of packets,
   wherein said blocks are selected in an uneven selection distribution, such that blocks with a higher priority are selected more often to take part in a packet.

10. A method according to claim. 9, Wherein said uneven distribution is substantially stepped, having fewer than five different selection probabilities.

11. A method according to claim 9, wherein said uneven distribution is substantially continuous, having more than 5 different selection probabilities.

12. A method of encoding data for transmission over a communication medium, comprising:
   providing at least a portion of a file as a plurality of blocks;
   selecting a subset of said blocks;
   generating a packet by combining said blocks, such that an individual block cannot be reconstructed from a single packet;
   transmitting said packet over an open channel;
   repeating said selecting, said generating and said transmitting as long as said channel is open and after at least twice as many packets as required for reconstructing the file are transmitted.

13. A method according to claim 12, wherein said repetition continues for after at least 10 times the required number of packets are transmitted.

14. A method according to claim 12, wherein said repetition continues for after at least 50 times the required number of packets are transmitted.

15. A method according to claim 12, wherein said selecting comprises randomly selecting.

16. A method according to claim 12, wherein said selecting comprises selecting said subset to include fewer than 50% of said blocks.

17. A method according to claim 12, wherein said transmitted packets define a set of over-constrained equations without a single unique solution.

18. A method according to claim 12 comprising maintaining said channel as open as long as there exists a requester for said file.

19. A method of encoding data for transmission over a communication medium, comprising:
   providing at least a portion of a file as a plurality of blocks;
   randomly selecting a subset of said blocks, said selecting comprising selecting a block at a probability of below 40% for at least 80% of said blocks;
   generating a packet by combining said blocks, such that an individual block cannot be reconstructed from a single packet; and
   repeating said selecting and said generating for a plurality of packets.

20. A method according to claim 19, wherein said probability is below 20% for at least 80% of said blocks.

21. A method according to claim 19, wherein said probability is below 10% for at least 80% of said blocks.

22. A method according to claim 19, wherein said probability is below 5% for at least 80% of said blocks.

23. A method of transmitting information, comprising:
   providing at least a portion of a file as a plurality of blocks;
   selecting a subset of said blocks;
   generating a packet by combining said blocks, such that an individual block cannot be reconstructed from a single packet, said packets varying in an a-priori probability of a block being selected for inclusion in a packet.
   transmitting said packet;
   repeating said selecting, said generating and said transmitting for a plurality of packets;
   receiving at least some of said packets; and
   reconstructing said at least a portion of the file from said received packets.

24. A method according to claim 23, wherein said variation is unknown to said receiver.

25. A method according to claim 23, wherein said variation represents division into buckets.

26. A method according to claim 23, wherein said variation represents preferential encoding.

27. A method according to claim 23, wherein said variation represents changes in block selection probability per packet.

28. A method according to claim 23, wherein said variation represents providing a cross-bucket packet rather than a regular packet.

29. A method of encoding data for transmission over a communication medium, comprising:

provimg at least a portion of a file as a plurality of blocks;

randomly selecting a subset of said blocks, said selecting comprising selecting a block at a probability of above 60% for at least 2% of said blocks;

generating a packet by combining said blocks, such that an individual block cannot be reconstructed from a single packet; and repeating said selecting and said generating for a plurality of packets.

30. A method of encoding data for transmission over a communication medium, comprising:

providing at least a portion of a file as a plurality of blocks;

randomly selecting a subset of said blocks, said selecting comprising selecting a block at a probability of below 45% for some packets and above 45% for other packets;

generating a packet by combining said blocks, such that an individual block cannot be reconstructed from a single packet; and repeating said selecting and said generating for a plurality of packets.

* * * * *